United States Patent
Chan et al.

(10) Patent No.: US 8,875,533 B2
(45) Date of Patent: Nov. 4, 2014

(54) DATA CENTER OF HIGH HEAT DISSIPATION EFFICIENCY

(75) Inventors: Hung-Chou Chan, New Taipei (TW); Chao-Ke Wei, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 189 days.

(21) Appl. No.: 13/329,149

(22) Filed: Dec. 16, 2011

(65) Prior Publication Data

US 2013/0008200 A1 Jan. 10, 2013

(30) Foreign Application Priority Data

Jul. 7, 2011 (TW) .............................. 100123992 A

(51) Int. Cl.
*F25D 23/00* (2006.01)
*H05K 7/20* (2006.01)

(52) U.S. Cl.
CPC .................. *H05K 7/20827* (2013.01)
USPC ...................................................... 62/259.2

(58) Field of Classification Search
CPC .................................................. H05K 7/2087
USPC .............. 62/259.2; 165/67; 361/696, 679.47; 454/184
See application file for complete search history.

(56) References Cited

U.S. PATENT DOCUMENTS

| | | | |
|---|---|---|---|
| 5,706,668 A * | 1/1998 | Hilpert .......................... | 62/259.2 |
| 7,011,576 B2 * | 3/2006 | Sharp et al. .................... | 454/184 |
| 7,534,167 B2 * | 5/2009 | Day .............................. | 454/187 |
| 2004/0180620 A1 | 9/2004 | Sharp et al. | |
| 2006/0276121 A1 * | 12/2006 | Rasmussen .................... | 454/184 |
| 2008/0098761 A1 * | 5/2008 | Zangari et al. .................. | 62/249 |
| 2008/0098763 A1 * | 5/2008 | Yamaoka ...................... | 62/259.2 |
| 2008/0232064 A1 * | 9/2008 | Sato et al. ...................... | 361/687 |
| 2009/0117842 A1 * | 5/2009 | Jie et al. ......................... | 454/184 |
| 2009/0151910 A1 * | 6/2009 | Kwon et al. ................... | 165/121 |
| 2009/0168345 A1 * | 7/2009 | Martini ......................... | 361/691 |
| 2009/0308579 A1 * | 12/2009 | Johnson et al. ........... | 165/104.34 |
| 2010/0190430 A1 * | 7/2010 | Rodriguez et al. ............ | 454/184 |
| 2010/0300650 A1 * | 12/2010 | Bean, Jr. ......................... | 165/67 |
| 2011/0105010 A1 * | 5/2011 | Day .............................. | 454/184 |
| 2011/0123036 A1 * | 5/2011 | Barath et al. ................. | 381/71.3 |

FOREIGN PATENT DOCUMENTS

TW 403193 M 5/2011

* cited by examiner

*Primary Examiner* — Frantz Jules
*Assistant Examiner* — Emmanuel Duke
(74) *Attorney, Agent, or Firm* — Novak Druce Connolly Bove + Quigg LLP

(57) ABSTRACT

A data center includes a container, a server system, an air conditioner, and an air guide. The container includes a floor, and a sidewall that defines a through hole adjacent to the floor. The server system includes a rack and a number of servers mounted in the rack. The rack defines an air outlet apart from but facing the sidewall. The air conditioner includes an evaporator and a condenser. The evaporator is positioned on the top of the rack. The condenser defines an outlet and is sandwiched between the bottom of the rack and the floor and extending through the through hole. The air outlet of the condenser faces outside of the container. The air guide is a sheet extending from an edge of the evaporator that is distant from the rack and then bends to extend toward the floor.

4 Claims, 1 Drawing Sheet

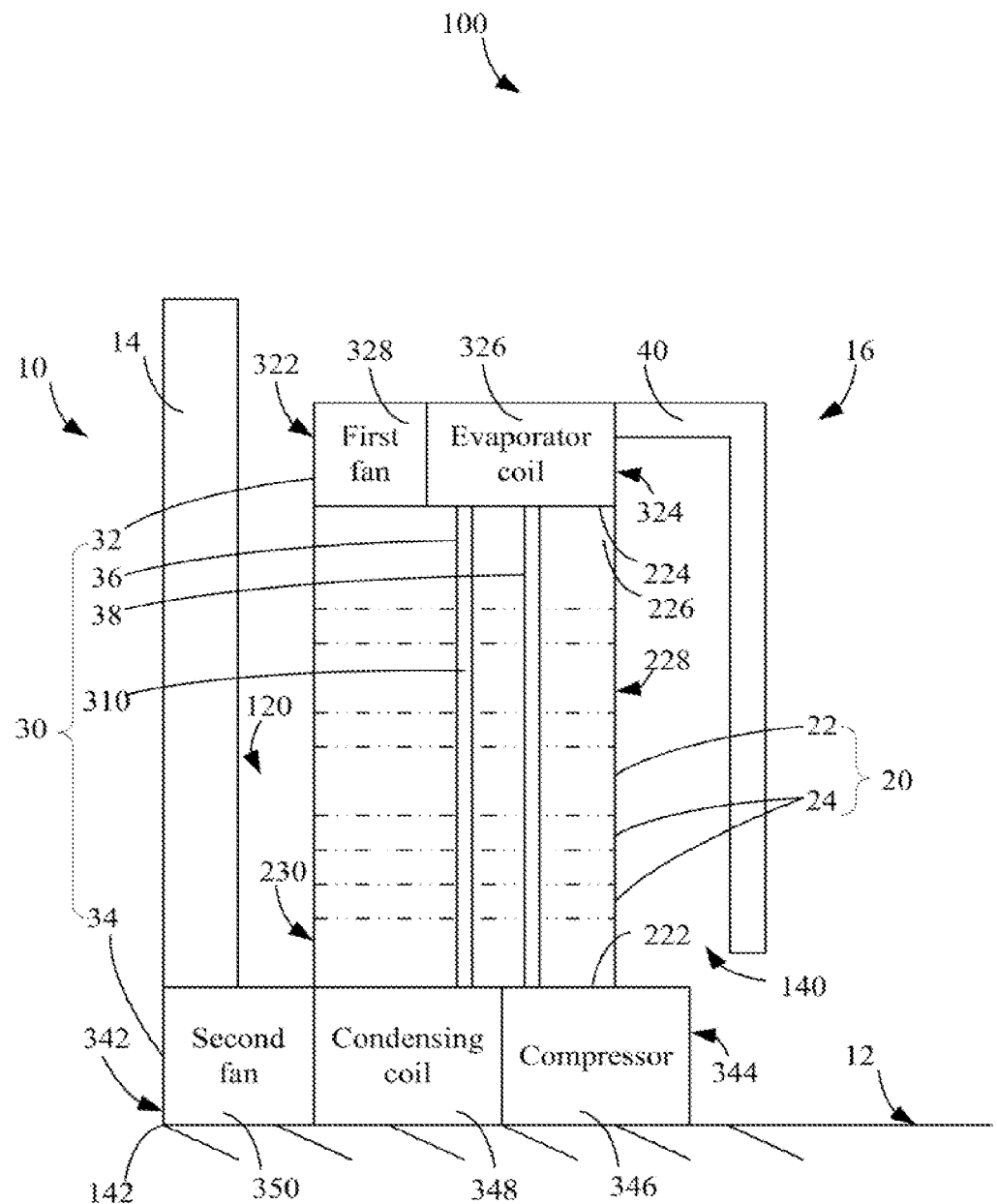

DATA CENTER OF HIGH HEAT DISSIPATION EFFICIENCY

BACKGROUND

1. Technical Field

The present disclosure relates to data centers and, particularly, to a data center which is efficient in heat dissipation.

2. Description of Related Art

Data centers typically include a number of server systems and a cooling system for supplying cool air to the server systems for heat dissipation. However, heat dissipation requirements of the server systems typically cannot be both met, as current cooling systems cannot supply cool air to the server systems individually or selectively even though the server systems often require different amounts of cooling air.

Therefore, it is desirable to provide a data center, which can overcome the above-mentioned problems.

BRIEF DESCRIPTION OF THE DRAWING

Many aspects of the present disclosure can be better understood with reference to the following drawing. The components in the drawings are not necessarily drawn to scale, the emphasis instead being placed upon clearly illustrating the principles of the present disclosure.

The FIGURE is a schematic view of a data center, according to an embodiment.

DETAILED DESCRIPTION

Embodiments of the present disclosure will now be described in detail with reference to the drawing.

Referring to the FIGURE, a data center 100, according to an embodiment, includes a container 10, a server system 20, an air conditioner 30, and an air guide 40.

The container 10 includes a floor 12, a sidewall 14, and a ceiling (not shown), which cooperatively define a receiving space 16 between the floor 12, the sidewall 14, and the ceiling. The sidewall 14 defines a through hole 142, adjacent to the floor 12.

The sever system 20 is received in the receiving space 16 and includes a rack 22 and a number of servers 24 mounted in the rack 22.

The rack 22 is a hollow rectangular tube in shape and includes a bottom plate 222, a top plate 224, and a pair of parallel sidewalls 226 connecting the bottom plate 222 and the top plate 224. The rack 22 defines an air inlet 228 and an air outlet 230, positioned at two opposite sides of the sidewalls 226 that do not connect the bottom plate 222 and the top plate 224. The rack 22 is positioned such that the air outlet 230 faces but is spaced away from the sidewall 14 of the container 10, cooperatively forming a dissipating space 120 therebetween.

The servers 24 are positioned between the air inlet 228 and the air outlet 230 and generate heat when working.

The air conditioner 30 includes an evaporator 32, a condenser 34, a first refrigerant pipe 36, a second refrigerant pipe 38, and a refrigerant 310.

The evaporator 32 is positioned on the top plate 224, and defines an air inlet 322, facing the sidewall 14 of the container 10, and an air outlet 324, opposite to the air inlet 322 of the evaporator 32. The evaporator 32 includes an evaporator coil 326 and a first fan 328 positioned between the air inlet 322 and the air outlet 324 of the evaporator 32.

The condenser 34 is sandwiched between the floor 12 and the bottom plate 222 and extends into the through hole 142.

That is to say, the condenser 34 is placed on the floor 12 and inserts into the through hole 142, and the rack 22 stands on the condenser 34. The condenser 34 defines an air inlet 342 facing outside of the container 10 and an air outlet 344 opposite to the air inlet 342. The condenser 34 includes a compressor 346, a condensing coil 348, and a second fan 350, all of which are positioned between the air inlet 342 and the air outlet 344 of the condenser 34.

The first refrigerant pipe 36 and the second refrigerant pipe 38 are attached to one of the sidewalls 226 of the rack 22. The first refrigerant pipe 36 communicates the condensing coil 348 with the evaporator coil 326. The second refrigerant pipe 38 communicates the evaporator coil 326 with the compressor 346.

The air guide 40 is a sheet made of, for example, plastic, and extends away from an edge of the evaporator 32 that is distant form the rack 22 substantially along a direction that is parallel to the floor 12 and then bends to extend towards the floor 12. As such, the air inlet 228 of the rack 22 is apart from but shielded by the air guide 40, forming a cooling space 140 therebetween.

In operation, the heat generated by the servers 24 is directed into the evaporator 32 by the first fan 328 and is extracted from the dissipating space 120 and the cooling space 140 by a refrigeration cycle of the air conditioner 30. During the refrigeration cycle, the refrigerant 310 (liquid) is pumped into the evaporator coil 326 from the condensing coil 348 via the first refrigerant pipe 36. In the evaporator coil 326, the refrigerant 310 (liquid) is caused to evaporate into a vapor, generating cool airflow into the cooling space 140 for the servers 24. Then in the condenser 34, the refrigerant 310 (vapor) is directed to the compressor 346 via the second refrigerant pipe 38. In the compressor 316, the refrigerant 310 (vapor) is compressed and forced through the condensing coil 348, condensing the refrigerant 310 (vapor) back into a liquid and thus emitting the heat absorbed in the container 10 into airflow from the second fan 350.

In other embodiments, more sets of server systems, air conditioners, and air guides can be employed in the data center 10 so that different systems can receive different amounts of cooling air according to need.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the possible scope of the disclosure but do not restrict the scope of the disclosure.

What is claimed is:

1. A data center, comprising:

a container comprising a floor and a sidewall perpendicularly extending up from the floor, the sidewall defining a through hole adjacent to the floor;

a server system received in the container and comprising a rack and a plurality of servers received in the rack, the rack comprising a bottom plate and a top plate, and further defining an air inlet and an air outlet both located between the bottom plate and the top plate, the air inlet facing but being spaced away from the sidewall;

an air conditioner comprising an evaporator positioned on the top plate and a condenser sandwiched between the floor and the bottom plate and extending into the through hole, the evaporator defining an air inlet facing the sidewall and an air outlet opposite to the air inlet of the evaporator, the condenser defining an air inlet facing outside of the container; and an air guide, the air guide being a sheet extending from an edge of the evaporator that is distant from the rack and the sidewall substantially along a direction that is parallel to the floor and away from the sidewall and then bends to extend towards the floor, the air inlet of the rack being apart from but shield by the air guide.

2. The data center of claim 1, wherein the evaporator comprises an evaporator coil and a first fan positioned between the air inlet and the air outlet of the evaporator, and the first fan faces the air inlet.

3. The data center of claim 2, wherein the condenser comprises a compressor, a condensing coil, and a second fan, all of which are positioned between the air inlet and the air outlet of the condenser, the second fan faces the air inlet of the condenser, and the compressor faces the air outlet of the condenser.

4. The data center of claim 3, wherein the air conditioner comprises a first refrigerant pipe, a second refrigerant pipe, and a refrigerant, the first refrigerant pipe and the second refrigerant pipe are attached to one of the sidewalls of the rack, the first refrigerant pipe communicates the condensing coil with the evaporator coil, the second refrigerant pipe communicates the evaporator coil with the compressor, and the refrigerant is circulated through the first refrigerant pipe, the evaporator coil, the compressor, and the condensing coil.

* * * * *